US010798847B2

(12) United States Patent
Schroeder et al.

(10) Patent No.: US 10,798,847 B2
(45) Date of Patent: Oct. 6, 2020

(54) MODULAR HEAT TRANSFER SYSTEM

(71) Applicant: Intel Corporation, Santa Clara, CA (US)

(72) Inventors: Michael Aaron Schroeder, Chandler, AZ (US); Erich Nolan Ewy, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/019,603

(22) Filed: Jun. 27, 2018

(65) Prior Publication Data

US 2019/0045662 A1    Feb. 7, 2019

(51) Int. Cl.
*H05K 7/20* (2006.01)

(52) U.S. Cl.
CPC ..... *H05K 7/20272* (2013.01); *H05K 7/20254* (2013.01); *H05K 7/20263* (2013.01); *H05K 7/20436* (2013.01); *H05K 7/20872* (2013.01)

(58) Field of Classification Search
CPC .......... H05K 7/20272; H05K 7/20263; H05K 7/20436; H05K 7/20872
See application file for complete search history.

(56) References Cited

U.S. PATENT DOCUMENTS

| 6,796,370 | B1* | 9/2004 | Doll | F28F 3/048 |
| | | | | 165/168 |
| 7,238,881 | B1* | 7/2007 | Barr | H01L 24/98 |
| | | | | 174/17 VA |
| 7,272,006 | B2* | 9/2007 | Mongia | H01L 23/4006 |
| | | | | 165/80.4 |
| 7,621,723 | B2* | 11/2009 | Okubo | F04B 17/044 |
| | | | | 361/699 |
| 7,916,483 | B2 | 3/2011 | Campbell et al. | |
| 2003/0019234 | A1* | 1/2003 | Wayburn | G06F 1/20 |
| | | | | 62/259.2 |
| 2007/0023167 | A1* | 2/2007 | Liu | H01L 23/473 |
| | | | | 165/80.4 |
| 2007/0103869 | A1* | 5/2007 | Liu | H01L 23/473 |
| | | | | 361/699 |

(Continued)

FOREIGN PATENT DOCUMENTS

KR    200296810 Y1    12/2002

OTHER PUBLICATIONS

International Search Report and Written Opinion in International Patent Application No. PCT/US2019/033736 dated Sep. 27, 2019, 15 pages.

*Primary Examiner* — Jayprakash N Gandhi
*Assistant Examiner* — Michael A Matey
(74) *Attorney, Agent, or Firm* — Patent Capital Group

(57) ABSTRACT

In one aspect, an apparatus comprises a first housing and a second housing. The first housing comprises a surface to receive heat from a heat-generating component. The second housing comprising a receptacle in which to receive the first housing. The first housing is to nest within the receptacle. The receptacle inhibits movement of the first housing along a first axis and facilitates movement of the first housing along a second axis. The first housing is moveable within the receptacle along the second axis. Movement of the first housing along the second axis changes a size of a gap between the surface and the heat-generating component.

21 Claims, 12 Drawing Sheets

(56) References Cited

U.S. PATENT DOCUMENTS

| | | | |
|---|---|---|---|
| 2012/0051057 A1* | 3/2012 | Misener | G01B 11/27 362/259 |
| 2012/0120599 A1* | 5/2012 | Chua | H01L 23/473 361/690 |
| 2013/0330120 A1* | 12/2013 | Blanchard | F16B 21/165 403/322.2 |
| 2015/0131224 A1* | 5/2015 | Barina | G06F 1/20 361/679.53 |
| 2015/0289359 A1 | 10/2015 | Schmidt et al. | |
| 2016/0201827 A1* | 7/2016 | Tower | F16K 99/0034 137/315.11 |
| 2016/0381827 A1* | 12/2016 | Morse | H05K 9/0081 361/699 |
| 2017/0105312 A1* | 4/2017 | Tsai | H01L 23/473 |
| 2018/0005921 A1* | 1/2018 | Takemura | H01L 23/473 |
| 2018/0242520 A1* | 8/2018 | Zenkus | A01D 34/4165 |

* cited by examiner

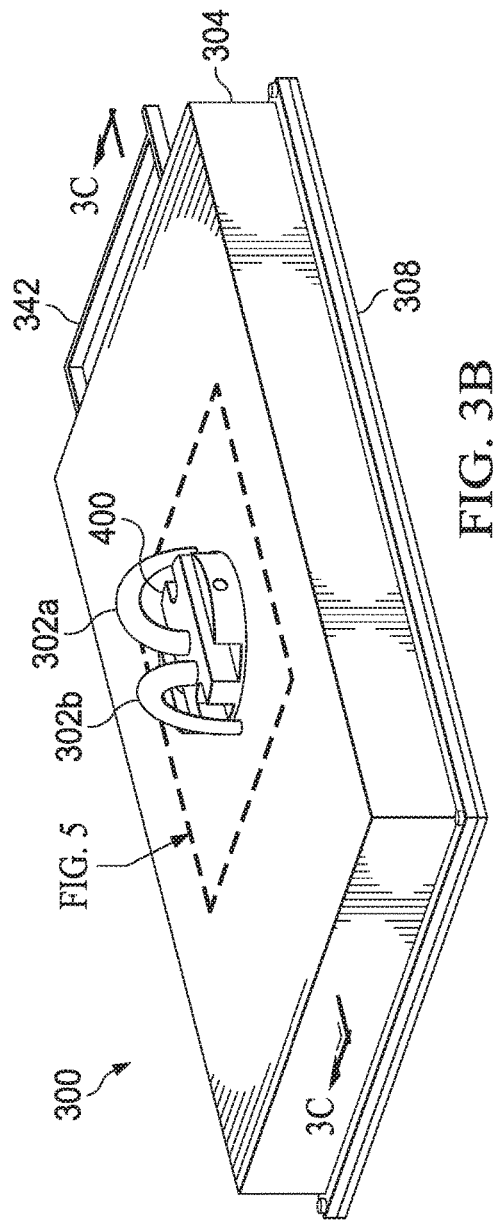
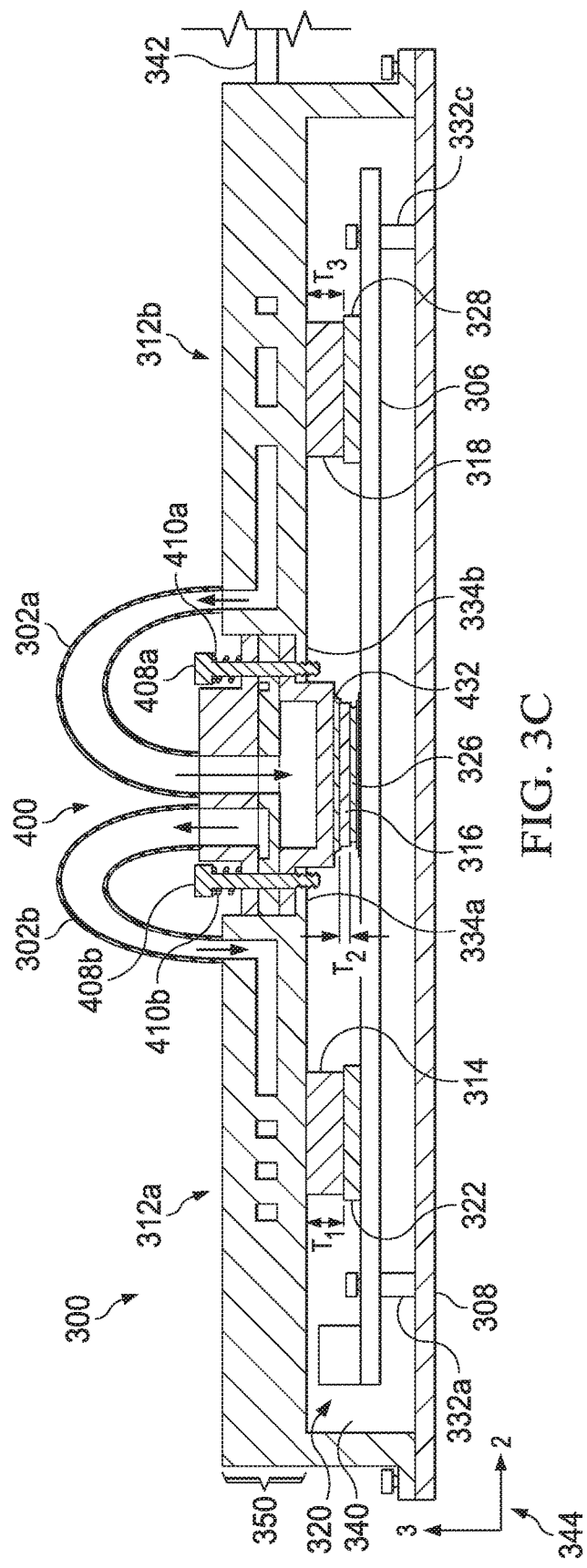

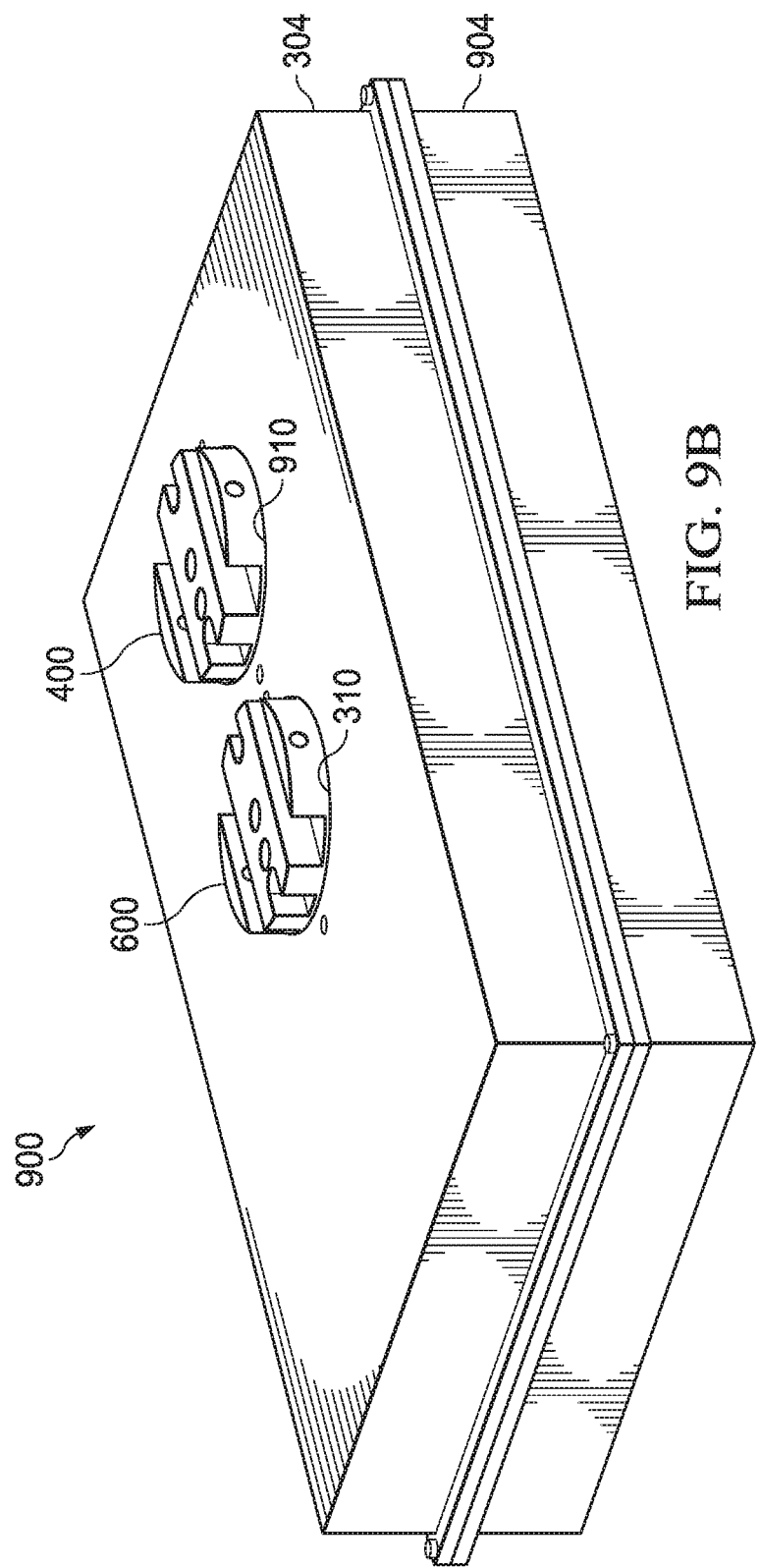

MODULAR HEAT TRANSFER SYSTEM

TECHNICAL FIELD

Embodiments described generally relate to the field of temperature control systems and more particularly to modular systems for dissipating heat.

BACKGROUND

Many devices (e.g., electrical devices, mechanical devices, and/or electromechanical devices) generate heat during operation. Such devices can include, for example, a mobile phone, a computer, a set top boxes, an automobile, an aircraft, manufacturing equipment. In many cases, the generated heat must be dissipated to prevent the device and/or the components therein from overheating.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 3A, 3B, and 3C illustrate various views of another system, according to some embodiments of the present disclosure;

FIGS. 9A and 9B illustrate various views of a system 900, according to some embodiments of the present disclosure.

DESCRIPTION OF EMBODIMENTS

Figure 1:
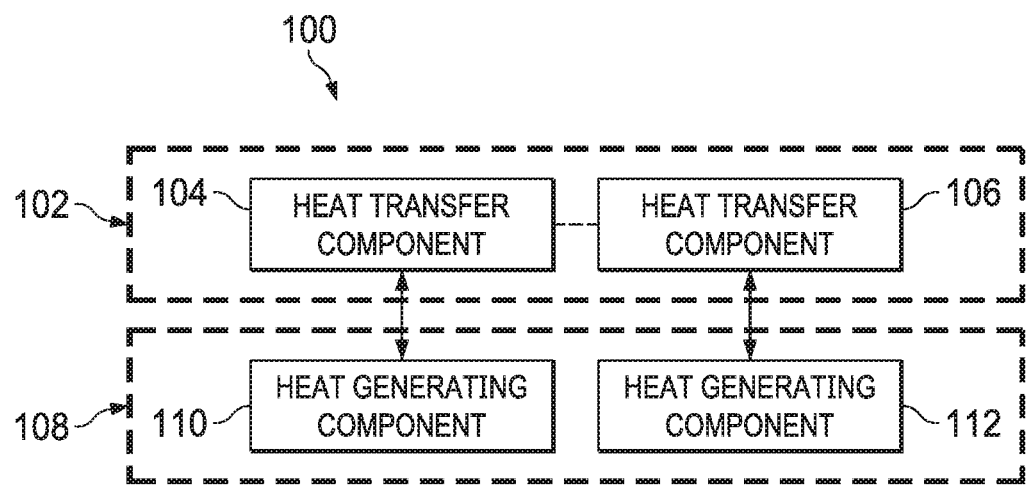
FIG. 1 is a simplified component diagram illustrating components of an apparatus, according to some embodiments of the present disclosure.

A device may include one or more heat-generating components. A heat-generating component generates heat during its operation. For example, a heat-generating component can comprise a processor, a power source (e.g., battery), a power converter, a sensor, mechanical component (e.g., a piston), an integrated circuit, a component operably coupled to circuit board, and/or any other device or component (electrical and/or mechanical). One technical challenge for such devices is that the generated heat must be dissipated to prevent the device (and/or the components therein) from reaching a limiting temperature (e.g., a temperature at which the device and/or component stops functioning or its functioning is impaired (e.g., reduced efficiency)). In many cases, the devices generate more heat than they can dissipate without assistance from a cooling system.

Heat-transfer systems are used to cool such devices and/or components by transferring heat away from heat-generating components. Such heat-transfer systems dissipate the heat by, e.g., rejecting some of the heat to the ambient environment and converting some of the heat to other forms of energy (such as kinetic energy) along the way (e.g., due to the law of conservation of energy). A heat-transfer system has a thermal resistance that quantifies its ability to transfer heat (i.e., its resistance to heat flow). Thermal resistance is measured, e.g., in degrees (e.g., Celsius (C) or Kelvin (K)) per watt (e.g., ° C./W or K/W). The thermal resistance relates the power (watts) input to the heat-transfer system to a difference in temperature (measured in ° C. or ° K) that results from the heat resistance of the heat-transfer system. The difference in temperature is measured between a heat source location and a heat rejection location. For each of a range of power inputs, the heat-transfer system produces a temperature difference value.

Another technical challenge is that some devices are subject to various dynamic forces during operation. Such dynamic forces can include impacts and/or vibrations. For example, a computing system attached to a vehicle may experience an impact load based on the vehicle making an abrupt stop and/or colliding with another object. The computing system may experience vibrations caused by the engine of the vehicle and/or by motion of the vehicle (e.g., caused by bumps or depressions in a surface on which the vehicle moves). Such a vehicle can include an automobile, a boat, an aircraft, a bike, a motor vehicle, and the like. Some devices include mechanisms to help protect from dynamic forces.

A housing may be used to protect a device from forces during operation. Components (including heat-generating components) of the device are at least in part, enclosed within the housing. Within the housing, some of the components are separated from the housing by a gap. A size of the gap may be measured in a linear distance between the housing and the component. In cases where a heat-generating component requires additional cooling by a heat-transfer system, a material may be used to fill the gap and facilitate transferring heat from the heat-generating component to the heat-transfer system. For example, a thermal interface material (TIM) may be used to fill the gap. In some cases, a gap filler material used in such applications can include a two-part material that cures and, once cured, is thermally conductive. In general, a thermal resistance of the material increases or decreases based the thickness of the material. For example, the thermal resistance increases as the thickness of the material increases; the thermal resistance decreases as the thickness of the material decreases.

Manufacturing tolerances associated with geometry of a housing and geometry of a heat-generating component can impact a size of a gap that lies between the heat-generating component the housing. In turn, the size of the gap can affect the thermal performance of heat-generating components. In some examples, an integrated circuit (IC) is located on a circuit board such as a printed circuit board (PCB). The IC may comprise a die, which is coupled to the circuit board with a solder. In such examples, a frame supports the circuit board and the housing such that a gap lies between the IC and the housing. The tolerances of components that are stacked upon other components can have a cumulative effect on the size of the gap. Because the size of the gap is a function of the geometry of each of the stacked components (i.e., in this example, the frame, the PCB, the IC, and the housing), the tolerances of the stacked components can add up to a potentially large tolerance in the size of the gap. As an example, some computing systems (e.g., those used in vehicles) are encapsulated in a sealed housing. The heat-generating components are cooled via conduction through the housing by using a thick TIM to accommodate the large tolerances due to design and manufacturing constraints. The size of the gap between the housing and the heat-generating component can be about 1 mm. For example, the gap may have nominal size of about 0.5 millimeters (mm) and a worst-case size of about 0.8 mm to 0.9 mm based on the cumulative tolerances of stacked components. As the size of the gap increases, so too does the thickness of the material required to fill the gap. As discussed above, the thermal resistance of the material increases with thickness. Thus, an increase in the gap size often results in an increase in the thickness of and, therefore, the thermal resistance of the material used to fill the gap. This increased thermal resistance can lead to increased operating temperatures of the heat-generating component, which can inhibit its ability to properly function, reduce an operational lifespan of the heat-generating component, reduce operational efficiency, cause a failure, and/or heat nearby components.

A large gap (e.g., a gap size of about 1 mm) can be a significant bottleneck for the performance and power of a heat-generating component. Because each stacked component may have a relatively fixed thermal resistance, the thickness of the TIM may be the only item in the stack-up that can be used to lower the total thermal resistance of the system and reduce the operating temperature of the heat-generating component. As an illustration, an example thermal stack-up may include the following (in order): a fluid operating at a temperature of about 76° C.; a convective cooling plate having a thermal resistance of about 0.06° C./W (fixed), a TIM that is about 0.9 mm thick and having a thermal resistance of about 0.14° C./W, and an IC having a thermal resistance of about 0.07° C./W (fixed). With this stack-up, if the IC operates at 165 W, the temperature at the junction between the IC and the TIM would be about 121° C. In this example, the TIM accounts for about 50% of the total thermal resistance of the system. Reducing the operating temperature and performance IC is contingent upon reducing the size of the gap and, therefore, reducing the thickness and thermal resistance of the TIM. Thus, another technical challenge is balancing the countervailing influences of large cumulative tolerances, which may result from a housing with fixed geometry, and the need for a relatively thin material to fill the gap between, which can result from the need for lower operating temperatures for heat-generating components.

A potential solution is to reduce the thickness of a material used to fill a gap between a housing and heat-generating component. However, because the thickness of the material is, in effect, set by the geometry of the components and housing, designers may have little control over the thickness. Some systems that use thinner a material rely on a spring to apply and maintain a force to keep the material in contact with the housing and heat-generating component during operation. Such systems are often directly supported by a circuit board on which the heat-generating component is located. The force applied by the spring and friction are all that hold the material in place in an in-plane direction (e.g., in a plane in which the circuit board lies) and an out-of-plane direction (e.g., perpendicular to the plane in which the circuit board lies). Such springs may work when the computing system experiences relatively static loading (e.g., in a non-moving application). Because these solutions utilize a spring to maintain the contact, they can fail to maintain the contact when subjected to the dynamic forces. For example, under dynamic loading such as vibrations or impact loads the spring may deflect causing a movement of the material and/or a surface applying the load to the material in the out-of-plane direction. In addition, such systems also have large tolerances in the in-plane direction. These large tolerances can enable large in-plane movement. Such movement (whether in-plane or out-of-plane) can cause damage to the heat-generating component.

A solution to the above identified challenges (and others) presented herein includes apparatuses, systems, and methods for, e.g., fixing a position of a housing such that it can withstand impact and vibrations while also enabling an adjustable gap size and applying an enabling load to a TIM. Such apparatuses and systems can be sealed to meet an international standard for protecting against intrusion of solids and liquids. In some embodiments, a modular housing system includes some portions of the housing being relatively fixed in relation to heat-generating components while other portions of the housing are moveable and, therefore able to adjust the size of gap relative to a heat-generating component. Advantageously, the housing can adjust to accommodate varying gap sizes (e.g., based on a stack-up of tolerances) in manufactured instances of a device. This adjustable feature enables the use of thinner thermal interface materials, which in turn, enables the use of higher power and higher performing heat-generating components in the device.

FIG. 1 is a simplified component diagram illustrating components of an apparatus 100. The apparatus 100 comprises an electronic system 108 and a heat-transfer system 102 to cool the electronic system 108. The heat-transfer system 102 includes heat-transfer components 104 and 106. The electronic system 108 includes heat-generating components 110 and 112. The heat-transfer components 104 and 106 cool the heat-generating components 110 and 112.

The heat-transfer components 104 and 106 are distinct from one another. Though the heat-transfer components 104 and 106 are noncontinuous with one another, they are coupled by an interface (e.g., as generally indicated by a dashed line between the heat-transfer components 104 and 106). The interface enables one of the heat-transfer components 104 and 106 to nest within the other. For example, the heat-transfer component 104 may nest within the heat-transfer component 106. The interface inhibits movement of the heat-transfer component 104 along a first axis and facilitates movement of the heat-transfer component 104 along a second axis. This can, for example, enable the heat-transfer component 104 to move along the second axis to adjust a size of a gap between the heat-transfer component 104 and the heat-generating component 110.

Figure 2:
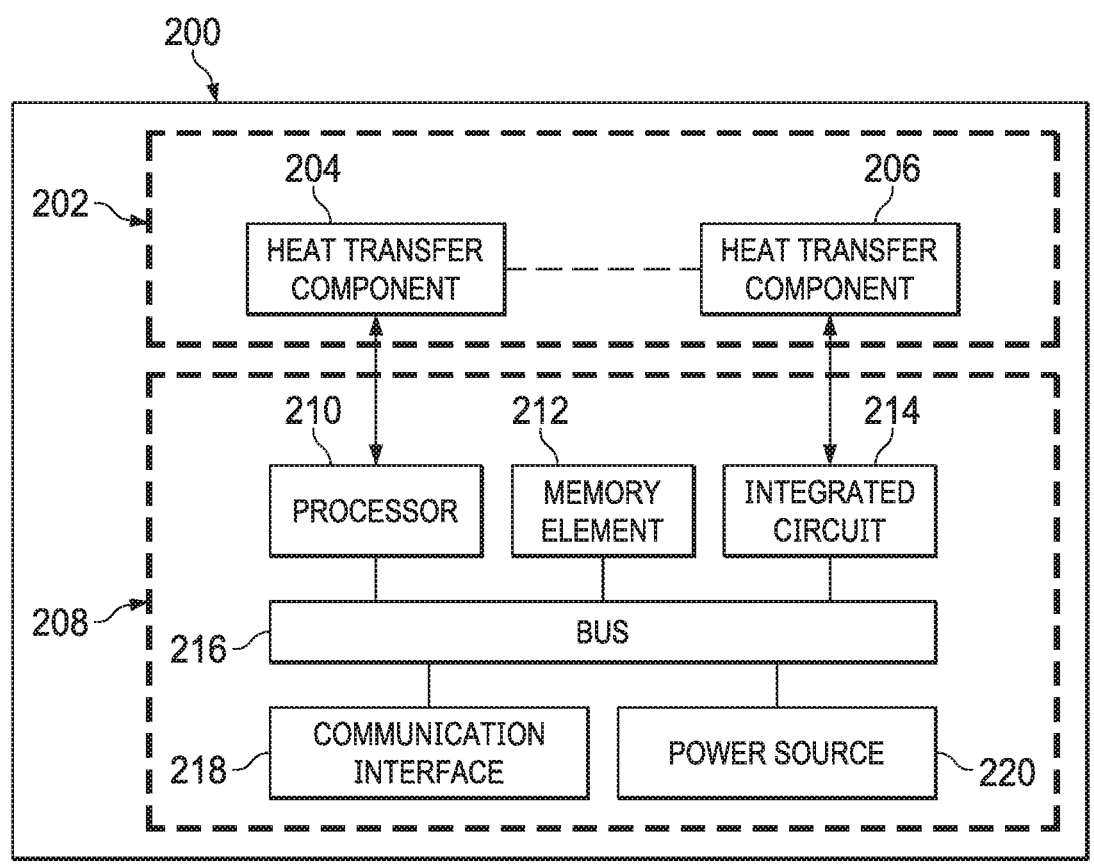
FIG. 2 is a simplified component diagram illustrating components of a system, according to some embodiments of the present disclosure.

FIG. 2 is a simplified component diagram illustrating components of a system 200. The system 200 is an example of the apparatus 100. The system 200 comprises a computing system 208 and a heat-transfer system 202. The heat-transfer system 202 includes heat-transfer components 204 and 206. The computing system 208 comprises a processor 210 for processing data, a memory element 212 for storing data, an integrated circuit (IC) 214 for processing data, a communication interface 218 for transmitting and receiving data over a network, a power source for providing power to the computing system 208, and a bus 216 to facilitate communications between the other components, each of which may generate heat during operation. The computing system 208 may comprise a circuit board to which each of the components is coupled.

The memory element 212 may comprise any form of volatile or non-volatile memory including, without limitation, magnetic media (e.g., one or more tape drives), optical media, random access memory (RAM), read-only memory (ROM), flash memory, removable media, an erasable programmable read only memory (EPROM), an electrically erasable programmable ROM (EEPROM)), or any other suitable memory component or components.

The processor 210 may be a microprocessor, controller, or any other suitable computing device, resource, or combination of hardware, stored software and/or encoded logic operable to process data.

The IC 214 may be a field programmable gate array (FPGA), an application-specific integrated circuit (ASIC) or any other type of integrated circuit. In some embodiments, the IC 214 includes a die. The IC 214 may include a ball grid array (BGA) providing an electrical interface to a circuit board. The die can be coupled to the circuit board with solder.

The heat-transfer system 202 dissipates the heat generated by the heat-generating components on the computing system 208. Each of the heat-transfer components 204 and 206 includes a housing. The heat-transfer component 204 includes a first housing, which cools the processor 210 by absorbing heat from the heat-generating component 110. The heat-transfer component 206 includes a second housing, which cools the IC 214 by absorbing heat from the IC 214. An interface enables one of the heat-transfer components 204 and 206 to nest within the other. As an example, the second housing of the heat-transfer component 206 may include a receptacle operable to receive nesting of the first housing of the heat-transfer component 204. As another example, the first housing of the heat-transfer component 204 may include a receptacle operable to receive nesting of the second housing of the heat-transfer component 206.

For clarity, FIGS. 1 and 2 depict a specific number heat-transfer components and heat-generating devices. However, any number of heat-transfer components and heat-generating devices may be implemented in systems, apparatuses, devices, and methods of the present specification.

Figure 3A:
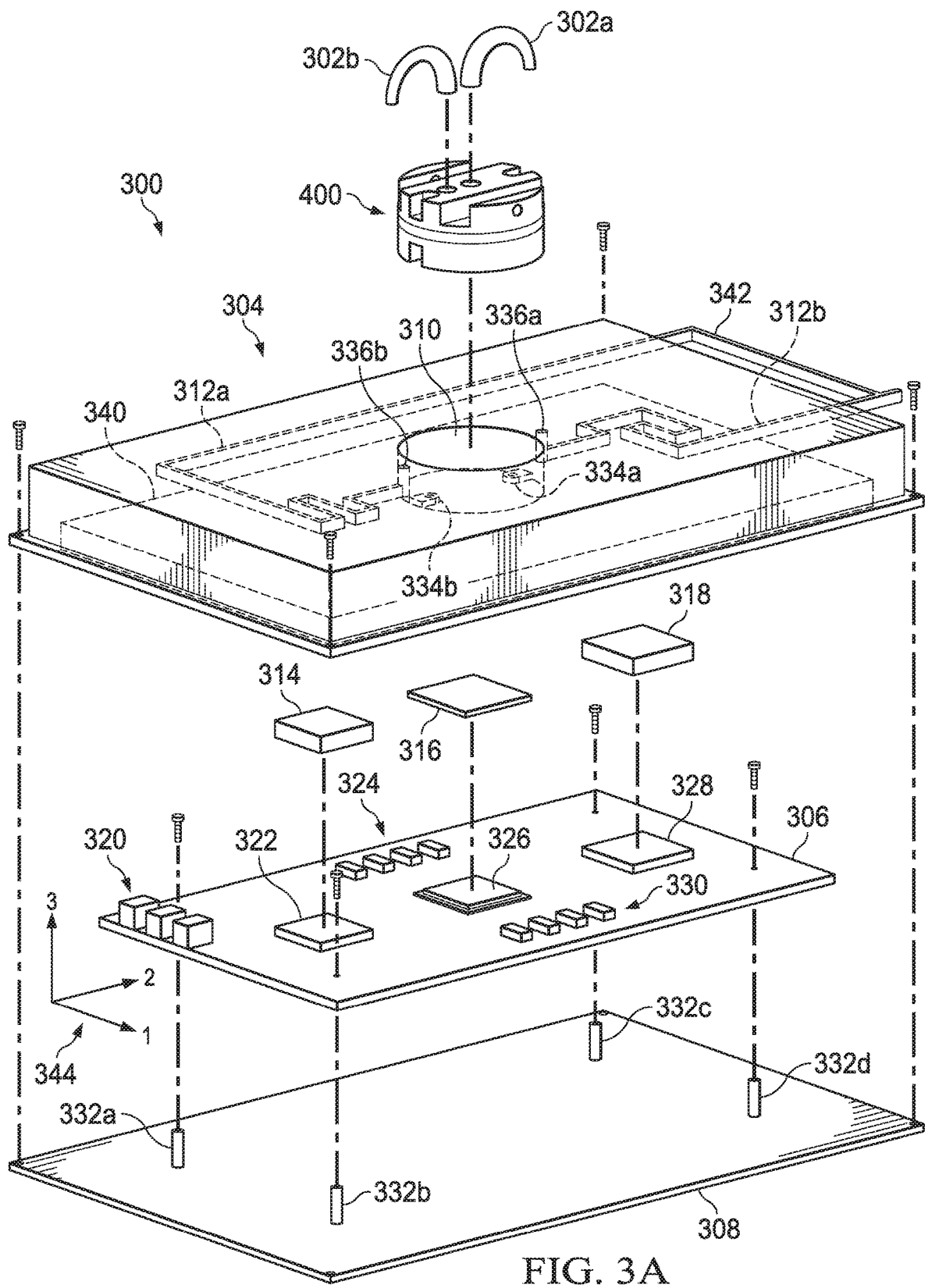

FIGS. 3A, 3B, and 3C illustrate various views of a system 300, according to some embodiments of the present disclosure. The system 300 is an example of the system 200 of FIG. 2. The system 300 comprises a computing system and a heat-transfer system to transfer heat away from the computing system. FIG. 3A is a partially exploded diagram of the system 300. FIG. 3B is a diagram of the system 300 when assembled. FIG. 3C is a sectional view of the system 300 when assembled as shown in FIG. 3B (e.g., from a viewpoint as generally indicated by the section lines labeled "3C" in FIG. 3B). In addition, FIG. 3C illustrates an example operation of the system 300 while dissipating heat from heat-generating components. A set of axes 344 includes a first axis 344-1, a second axis 344-2, and a third axis 344-3 (e.g., X-, Y-, and Z-axis). Each of the axes 344 is perpendicular to each of the other axes.

The heat-transfer system includes a housing 304, a cold-block 400, and a plate 308. The cold-block 400 includes a housing that is noncontinuous with the housing 304; the housings are distinct from one another. The housing 304 and/or the housing of the cold-block 400 are made of a rigid material. In some examples, the housing is made of a metallic material (e.g., steel (e.g., stainless steel), aluminum, alloy, or any other metal). The computing system includes a plurality of heat-generating components each of which is coupled to a circuit board 306. The plurality of heat-generating components includes a processor 322, an integrated circuit (IC) 326, a processor 328, memory elements 324, memory elements 330, and communication interface elements 320. Pillars 332a, 332b, 332c, and 332d support the circuit board 306 on the plate 308. Fasteners fasten the housing 304 and the plate 308 to one another to form a cavity 340 in which to enclose the computing system.

The heat-generating components generate heat, which is transferred by thermal interface materials (TIMs) to the heat-transfer system. The heat heat-transfer system transfers the heat to a liquid which can be pumped out to keep the computing system cool. The housing 304 receives heat from the processors 322 and 328 the memory elements 324 and 330. The housing 304 includes planar portion 350, a receptacle 310, conduits 312a and 312b, and openings 336a and 336b. The conduits 312a and 312b are embedded between an outer surface and an inner surface of the planar portion 350. Hoses 342 delivers a liquid to and from the conduits 312a and 312b. The liquid may include, water, coolant, and/or any other liquid operable to absorb heat. A pump may pump the liquid through the hoses 342. The conduits 312a and 312b facilitate flow of the liquid through the housing 304 between the hoses 342 and the openings 336a and 336b to cool the heat-generating components. The openings 336a and 336b connect the fluid to tubes 302a and 302b. The liquid absorbs heat from the heat-generating components. The conduit 312a zigzags in an area corresponding to the processor 322, which increases a volume of the liquid available to cool the processor 322. Likewise, the conduit 312b zigzags in an area corresponding to the processor 328. The liquid may flow in a single direction, e.g., from the hoses 342 into the conduit 312b, through the opening 336a into the tube 320a, through the cold-block 400 and out through the tube 302b, through the opening 336b, and finally through the conduit 312a and back to the hoses 342. Likewise, the liquid can flow in an opposite direction (e.g., from the conduit 312a to the conduit 312b).

The receptacle 310 receives insertion of the cold-block 400. In this example, the receptacle 310 comprises an opening that extends though the planar portion 350. In other example, the receptacle may be a recession, a protrusion, a combination of recessions and protrusions, and/or another other structure. The cold-block 400 receives heat from the IC 326. The cold-block 400 nests within the receptacle 310. The receptacle 310 includes tabs 334a and 334b to support the cold-block 400. Fasteners 408a and 408b couple the cold-block 400 to the housing 304 via the tabs 334a and 334b. The cold-block 400 is not directly connected to the circuit board 306. The tabs 334a and 334b suspend the cold-block 400 over the IC 326. Springs 410a and 410b surround a portion of the fasteners 408a and 408b. The springs 410a and 410b are to apply a load to a material (e.g., TIM 316) filling the gap between the cold-block 400 and the IC 326. The springs 410a and 410b apply an initial load to the IC 326 and the material (e.g., during assembly of the system 300) to reduce the gap before fixing the cold-block 400 in place. In some embodiments of the present disclosure, the springs 410a and 410b are replaced by a jig, a weight, a mechanical press, a hydraulic press, and/or a handload to apply the load.

While the cold-block 400 is nested, the receptacle 310 inhibits movement of the cold-block 400 in the first axis 344-1 and the second axis 344-2. The receptacle 310 facilitates movement of the cold-block 400 along the third axis 344-3. The cold-block 400 is separate from housing 304 and can move within the receptacle 310. A locking mechanism can fix the position of the cold-block 400 within the receptacle after the cold-block 400 reaches its final resting location within the receptacle. The locking mechanism extends between opposing faces of the cold-block 400 and the receptacle 310. Tubes 302a and 302b connect the cold-block 400 to the housing 304. Each tube transfers the liquid between the cold-block 400 and the housing 304 to cool the IC 326. The tubes 302a and 302b may include flexible connectors such as hoses that can accommodate the cold-block 400 moving up and/or down while remaining operational. Each may include a threaded connector at its ends to maintain the connection between the cold-block 400 and the housing 304.

Thermal interface materials (TIM) fill a gap between the heat-generating components and a respective heat-transfer component. The TIMs transfer thermal energy between the heat-generating components and the respective heat-transfer component. The TIM 314 transfers thermal energy from the processor 322 to the housing 304. The TIM 316 transfers thermal energy from the IC 326 to the cold-block 400. The TIM 318 transfers thermal energy from the processor 328 to the housing 304. The relative position of the heat-generating components and the housing 304 is fixed based on the geometry and tolerances of the stacked-up components in the system 300. Thus, a size of a gap between the processors 322 and 328 and the housing 304 is fixed. Because the cold-block 400 is movable along the third axis 344-3, a size of a gap between the IC 326 and the cold-block 400 is adjustable. The springs 410a and 410b are to apply a load to the cold-block 400 and compress the TIM 316 between the cold-block 400 and the IC 326. This load helps to create contact between the TIM 316 and the cold-block 400 and between the TIM 316 and the IC 326 to aid in the transfer of thermal energy. Because the size of the gap between the cold-block 400 and the IC 326 is adjustable and the size of the gap between the processors 322 and 328 and the housing 304 is fixed, the TIM 316 can be thinner than the TIMs 314 and 318. The TIM 314 has a thickness T1. The TIM 316 has a thickness T2. The TIM 318 has a thickness T3. T2 is less than the T1 and T3 due to the adjustability of the cold-block 400 in third axis 344-4. In some examples, T1 is less than half of T2 and/or T1 is less than half of T3. In some examples, T2 is about 0.1 mm and T1 and T3 are each about 1.0 mm.

Advantageously, a position of the cold-block 400 can be fixed in each of the three perpendicular axes 344. The receptacle 310 fixes the position in the first axis 344-1 and the second axis 344-2 (e.g., in-plane directions). The locking mechanism fixes the position in the third axis 344-3 (e.g., out-of-plane direction) after the springs 410a and 410b apply a load to ensure contact between the cold-block 400, the TIM 316, and the IC 326. The locking mechanism also fixes the size of the gap between the cold-block 400 and the IC 326. Once set, the locking mechanism inhibits movement of the cold-block 400 along the third axis 344-3. The locking mechanism, for example, can reduce the likelihood of the cold-block 400 damaging the IC 326 when the cold-block 400 is subjected to an impact, a vibration, and/or another dynamic load.

Figure 4A:
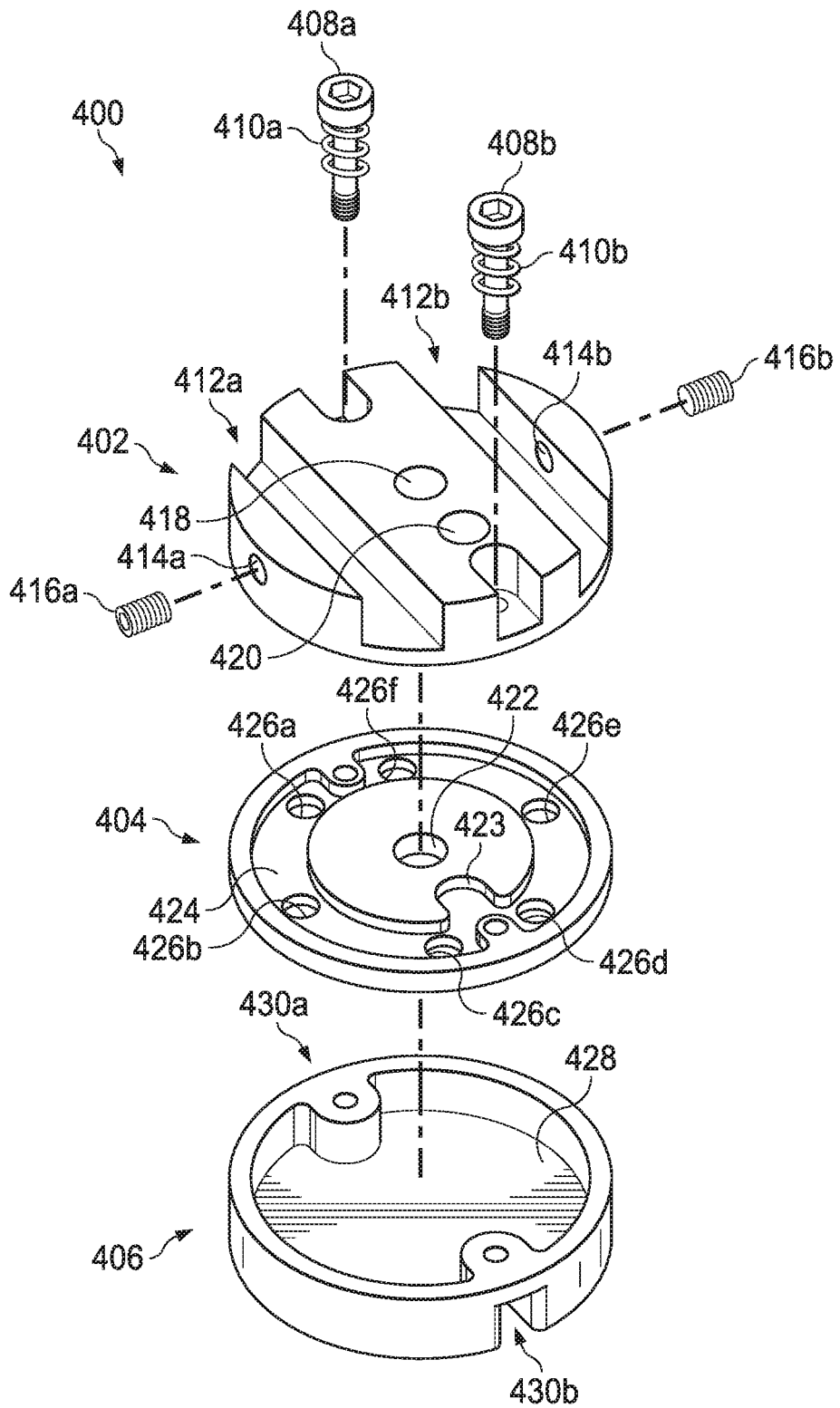
FIGS. 4A, 4B, and 4C illustrate various views of a cold-block, according to some embodiments of the present disclosure.
Figure 4B:
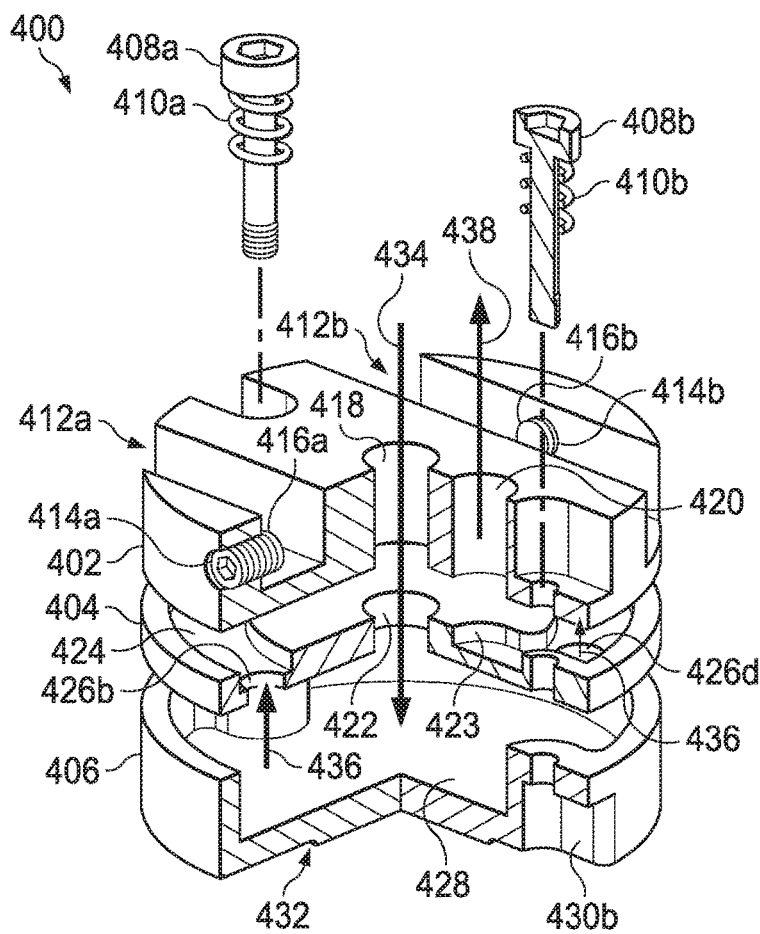
Figure 4C:
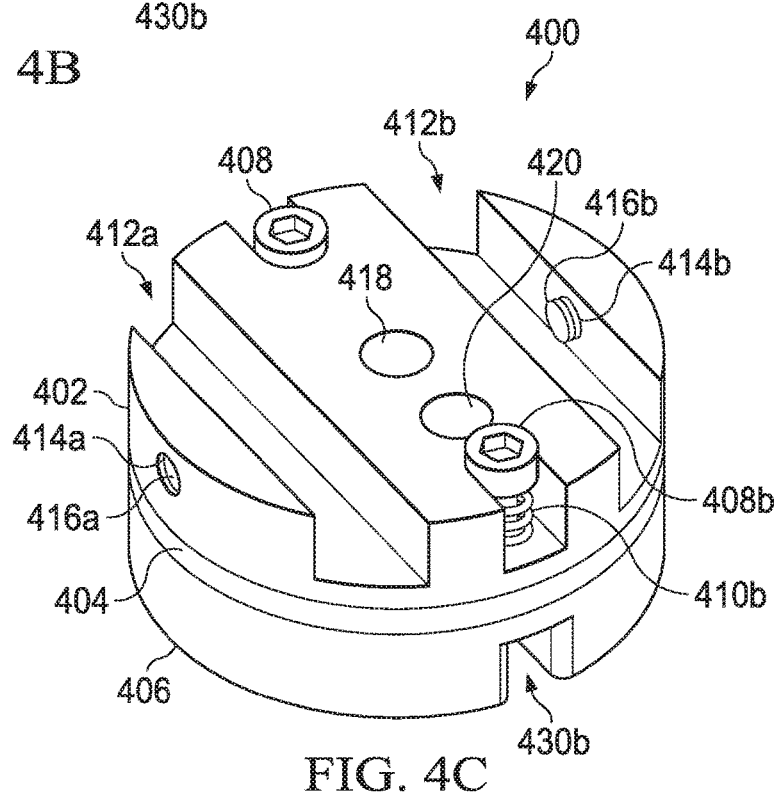

FIGS. 4A, 4B, and 4C illustrate various views of the cold-block 400 of the FIGS. 3A, 3B, and 3C. FIG. 4A is an exploded diagram of the cold-block 400. FIG. 4B is cutaway view of the cold-block 400. FIG. 4C is a view of the cold-block 400 when assembled.

The cold-block 400 includes a lid 402, a manifold 404, and a reservoir 406. Fasteners 408a and 408b extend though aligned openings in each of the lid 402, the manifold 404, and the reservoir 406. Springs 410a and 410b, which wrap around a portion of a shaft of the fasteners 408a and 408b, apply a load to the cold-block 400 to facilitate contact between the cold-block 400, a thermal interface material (TIM) (e.g., the TIM 316 of FIGS. 3A-3C), and the heat-generating component (e.g., the IC 326 of FIGS. 3A-3C).

The springs 410a and 410b apply an initial load to the heat-generating component and the TIM (e.g., during assembly of the system 300) to compress the TIM before fixing the cold-block 400 in place by the fasteners 408a and 408b. In some embodiments of the present disclosure, the springs 410a and 410b are replaced by a jig, a weight, a mechanical press, a hydraulic press, and/or a handload to apply the load. The lid 402 includes openings 418, 420, 414a, and 414b and recessions 412a and 412b. The openings 418 and 420 facilitate flow of liquid through the cold-block 400. The openings 414a and 414b are to receive setscrews 416a and 416b. The setscrews 416a and 416b extend from a face of the cold-block 400 to contact a face of the receptacle 310. The setscrews 416a and 416b can lock a position of the cold-block 400 along the third axis 344-3 to fix the size of the gap between the cold-block 400 and the heat-generating component (e.g., the IC 326 of FIG. 3A-3C). The recessions 412a and 412b provide clearance for a tool used to install and/or remove the setscrews 416a and 416b from the openings 414a and 414b. In some examples, the springs 410a and 410b are only to apply an initial enabling load during assembly. In such examples, the springs 410a and 410b are removed after the setscrews 416a and 416b lock the position of the cold-block 400. The reservoir 406 includes a cavity 428 to contain a liquid, recessions 430a and 430b for resting on supports (e.g., tabs 334a and 334b of the receptacle 310), and a protruding surface 432 to receive heat from the heat-generating component. The protruding surface 432 contacts the TIM. The manifold 404 includes a channel 424, an opening 422, and a recession 423. The channel 424 extends around the manifold 404. The passages 426a-e are in the channel 424. The recession 423 is continuous with the channel and, in part, aligns with the opening 420 in the lid 402. The opening 422 aligns with the opening 418 in the lid 402. The passages 426a-e couple the cavity 428 to the openings 418 and 420. The passages 426a-e facilitates a uniform flow of liquid through the cold-block 400 by forcing a radial flow when the liquid is moving between the cavity 428 and the openings 418 and 420. This can reduce the likelihood of "dead" spots of the flow of the liquid (e.g., eddies where a portion of the liquid can get trapped).

FIG. 4B shows, among other things, an example flow of liquid through the cold-block 400. In this example, the liquid flows into the cold-block 400 through the opening 418 and is discharged out of the cold-block 400 through the opening 420. The liquid flows from the opening 418 through the opening 422 to reach the cavity 428 as generally indicated by arrow 434. The liquid flows through the cavity 428 by flowing radially outwardly from the opening 422 to the passages 426a-e. The liquid flows through the passages 426a-e into the channel 424 as generally indicated by arrows 436. The liquid flows around the channel 424 to reach the recession 423. The liquid flows from the recession 423 through the opening 420 to exit the cold-block 400 as generally indicated by arrow 438. Similarly, the liquid can flow in the opposite direction (e.g., in the opening 420 and out of the opening 418).

FIG. 4C is a view of the cold-block 400 when assembled. During assembly, the lid 402, the manifold 404, and the reservoir 406 are joined together. The joining seals the components to one another and prevents the liquid from escaping between the components. As an example, the lid 402, the manifold 404, and the reservoir 406 may be brazed to join them to one another.

Figure 5:
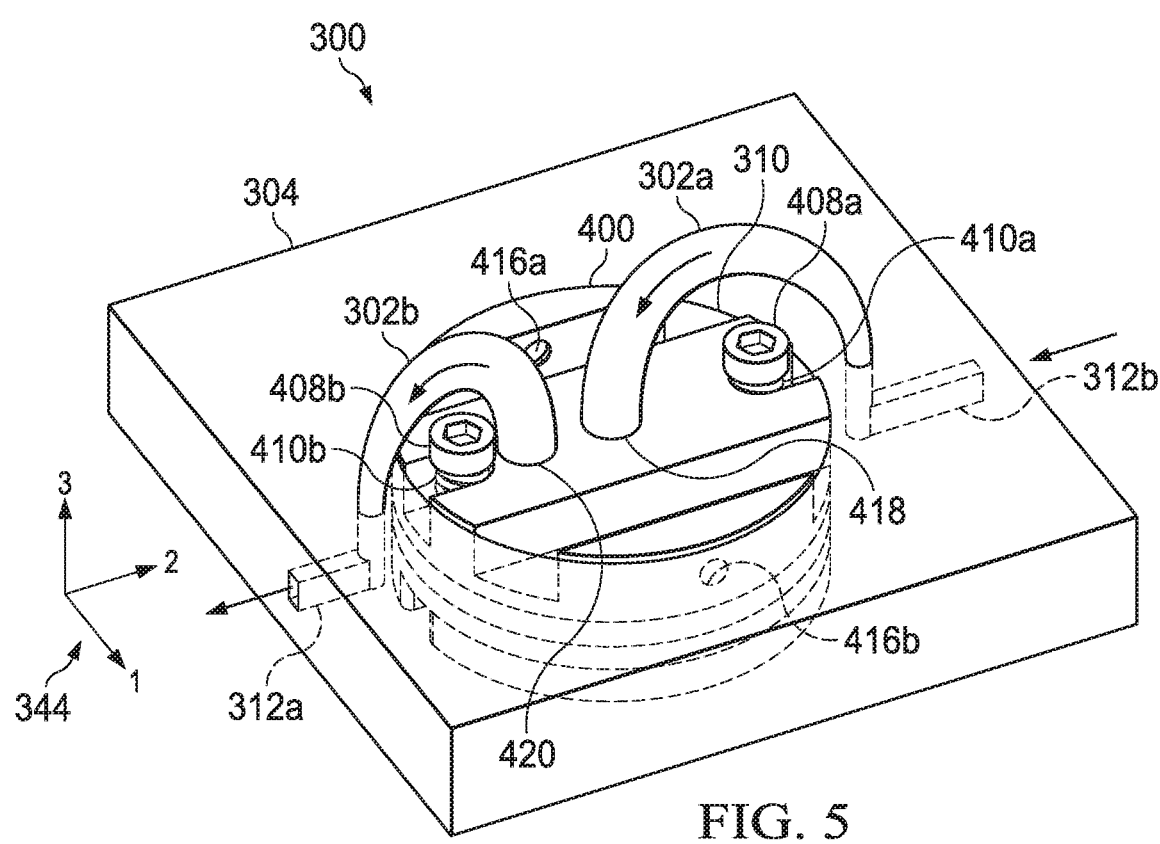
FIG. 5 illustrates a detailed view of a portion of the system of 3A, 3B, 3C, and 4.

FIG. 5 illustrates a detailed view of a portion of the system 300 in which the cold-block 400 is assembled and installed in the housing 304. The setscrews 416a and 416b are contacting a face of the receptacle 310 to fix the position of the cold-block 400 in the third axis 344-3. The face of the receptacle 310 and/or the tabs inhibit (e.g., stop and/or prevent) movement of the cold-block 400 in the first axis 344-1 and the second axis 344-2. The liquid flows from the conduit 312b, through the tube 302a, and into the cold-block 400. The fluid flows though the cold-block 400, for example, as described with respect to FIG. 4B. The fluid flows out of the cold-block 400, through the tube 302b, and into the conduit 312a.

Figure 6:
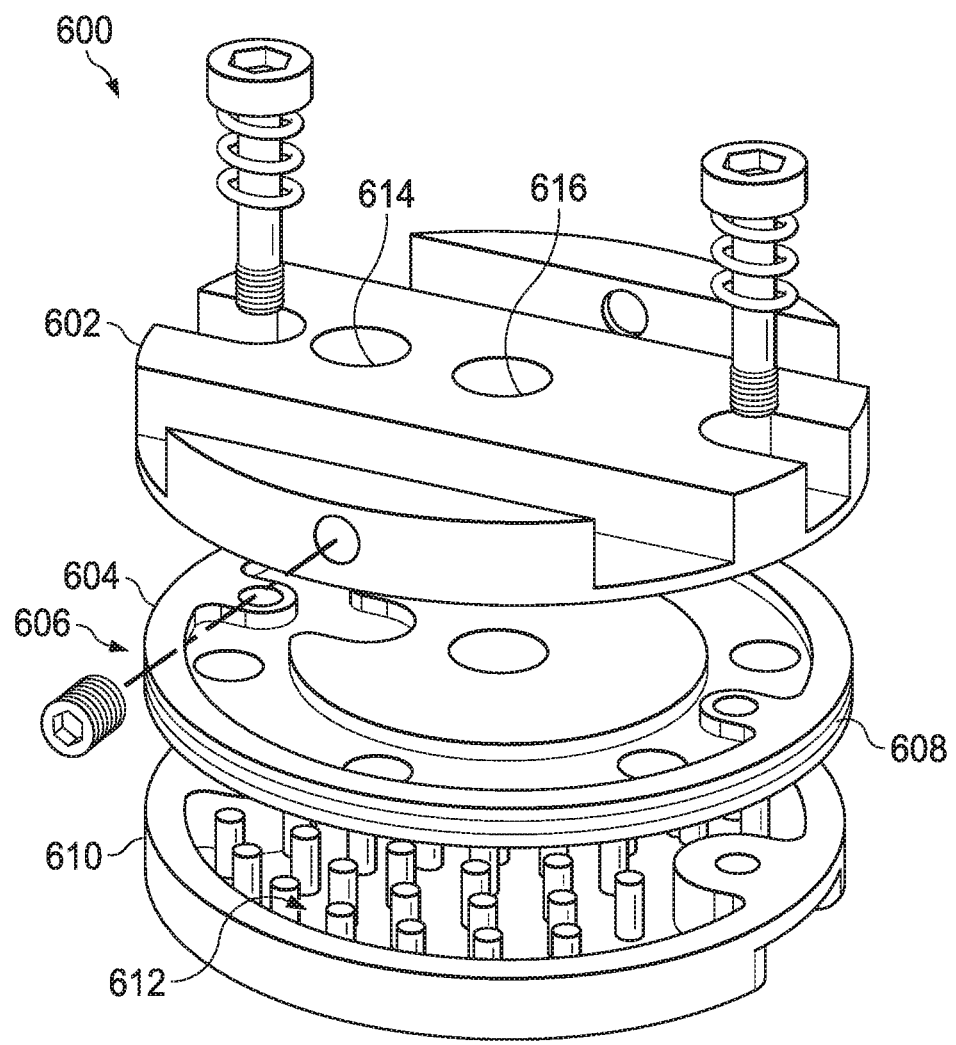
FIGS. 6, 7, and 8 illustrate another cold-block, according to some embodiments of the present disclosure.
Figure 7:
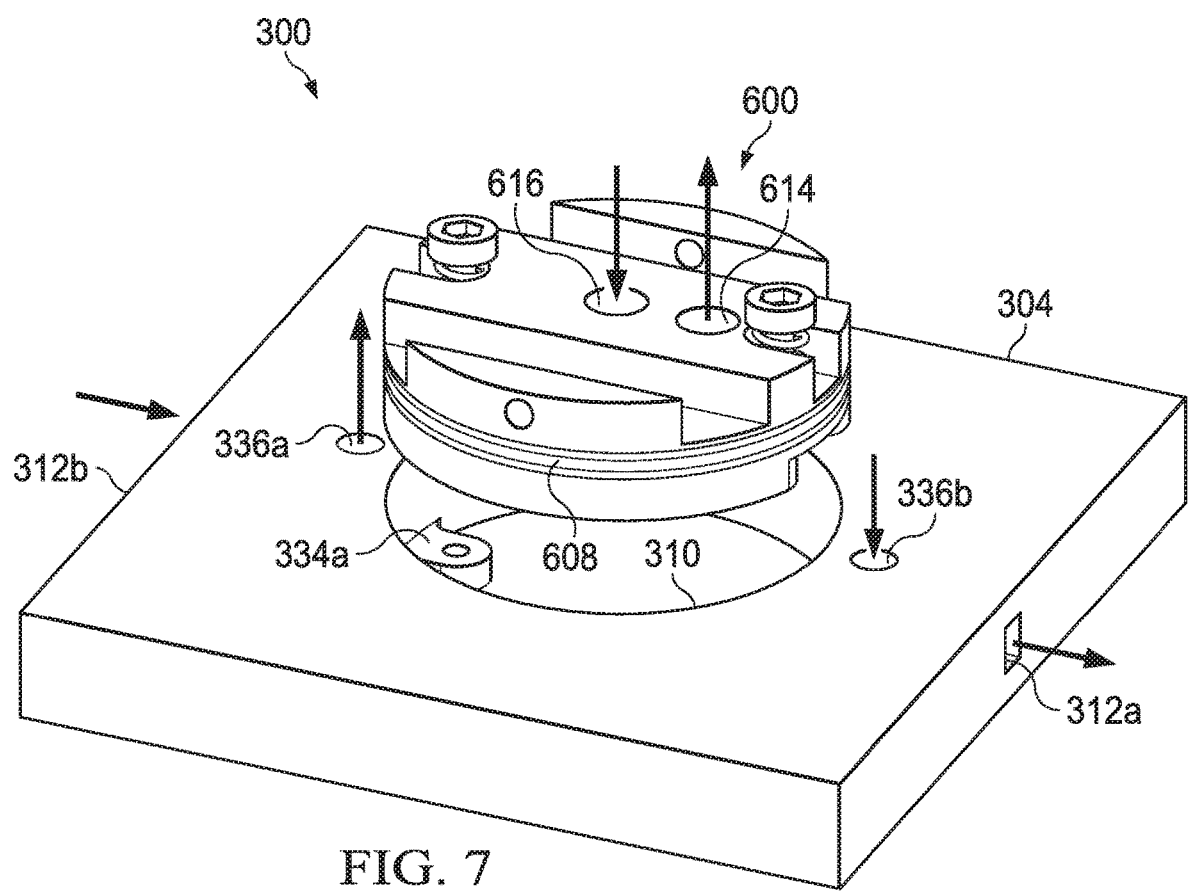
Figure 8:
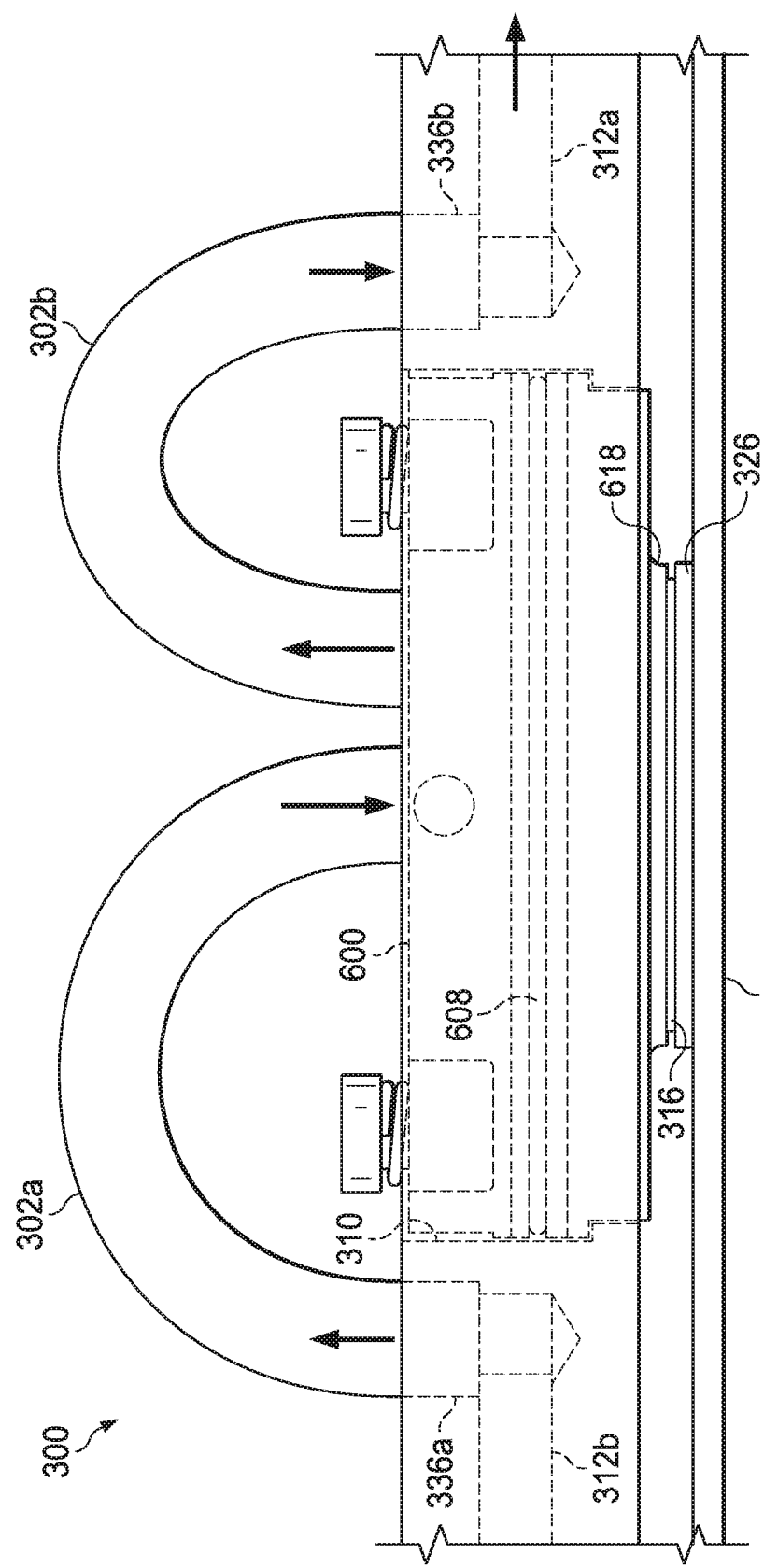

FIG. 6 illustrates an exploded view of a cold-block 600, according to some embodiments. FIGS. 7 and 8 illustrate views of a portion of the system 300 in which the cold-block 600 replaces the cold-block 400 of FIGS. 3A-3C. The cold-block 600 includes a lid 602, a manifold 604, and a reservoir 610, a protruding surface 618. The TIM 316 is located between the protruding surface 618 and the IC 326. The lid 602 includes openings 614 and 616 to facilitate flow of liquid through into and out of the cold-block 600. The cold-block 600 is similar to the cold-block 400 as described with respect to FIGS. 3A, 3B, 3C, 4A, 4B, and 4C. Some of the like components are not described and/or not described in detail here only for the sake of brevity. A difference between the cold-block 600 and the cold-block 400 is that, in the cold-block 600, the manifold 604 includes a recession 606 in which to hold a seal 608 and the reservoir 610 includes fins 612; the cold-block 400 lacks such features.

The cold-block 600 nests within the receptacle 310 and rests on the tabs 334a and 334b. Each heat-transfer component of the present disclosure is manufactured, e.g., using a manufacturing process. The manufacturing process can produce relatively small variations, or tolerances, in the manufacture of each heat-transfer device. Such tolerances do not prevent the heat-transfer components from properly functioning (i.e., the heat-transfer components will efficiently and effectively absorb heat from and transfer heat away from a heat-generating component). As an example, the size of the cold-block 600 and/or the receptacle 310 may vary based on tolerances. In some examples, the tolerances may create a worst-case gap between the cold-block and the receptacle of about 1 mm. In such examples, the receptacle still inhibits movement of the cold-block in a first axis (e.g., only allowing 1 mm or less of movement along the first axis) and facilitates movement of the cold-block along a second axis perpendicular to the first axis. Such a gap could potentially allow liquid and/or solids to enter the gap between the cold-block and the receptacle.

The seal 608 is operable to inhibit passage of liquid and/or solids between the opposing surfaces of the cold-block 600 and the receptacle 310. In this example, the seal 608 is an O-ring. The seal 608 may include an elastomeric material. The International Electrotechnical Commission (IEC) publishes IEC 60529 titled "Degrees of protection provided by enclosures (IP Code)," which is referred to hereinafter as the "IP Code." The IP Code is an international standard for classification of degrees of protection against solids and liquids provided by enclosures for electrical equipment. One version of the IP code, IEC 60529:1989+A1:1999+A2:2013, was published in 2013. The IP Code describes a rating system that uses the letters "IP" followed by a two-digit numeric code to describe the degrees of protection provided by enclosures. The first digit, which can range from zero to six, describes the protection from solids. The second digit, which can range from zero to 9, describes the protection from liquids. A zero, in either digit, means that no protection is offered. The higher the value of the digit, the more protection offered. For example, an IP rating of IP10 means that a device offers some protection for solids and no protection against liquids; a device having an IP rating of IP21 provides better protection for both solids and liquids than the device with the IP rating of IP10. The seal 608 seals a gap between the cold-block 600 and the receptacle 310. The seal 608 can prevent liquids and solids from entering from entering a sealed cavity in which the IC 326 is located (e.g., the cavity 340 of FIGS. 3A, 3B, and 3C). In some examples, the seal 608 enables the system 300 to reach an IP rating e.g., IPX7 (e.g. any value for solid and a minimum value of 7 for liquids), IPX8, and/or IPX9.

The fins 612 are configured to control the circulation of a liquid within a cavity of the reservoir 610. Each of the fins 612 extend from a wall of the reservoir 610. The fins 612 are generally uniformly spaced and in a radial pattern within the reservoir 610. Each of the fins 612 both controls circulation of the liquid and facilitate transfer of thermal energy between the liquid and the cold-block 600 by providing increased surface area (e.g., relative to the cold-block 400) with which to contact the liquid. The liquid easily flows around the fins 612 due, at least in part, to their smooth, cylindrical shape.

Turning to FIGS. 7 and 8, the liquid flows from the conduit 312b, through the opening 336a and into the cold-block 400 via a tube (e.g., the tube 302a). The liquid flows though the cold-block 600. While in the cold-block 600, the fins 612 help disrupt "dead" spots and facilitate a radial flow through the reservoir 610. The liquid flows out of the cold-block 600 via a tube (e.g., the tube 302b), through the opening 336b, into the conduit 312b, and though the conduit 312a.

It is noted that while the heat-transfer systems of FIGS. 3A, 3B, and 3C, 5, 7, and 8, included two housing members (system housing e.g., 304 and a housing of a cold-clock (e.g., 400, 600)) embodiments of the present disclosure are not limited to such an implementation. The following FIGS. 9A and 9B illustrate a heat-transfer system which can include more than two housing members.

Figure 9A:
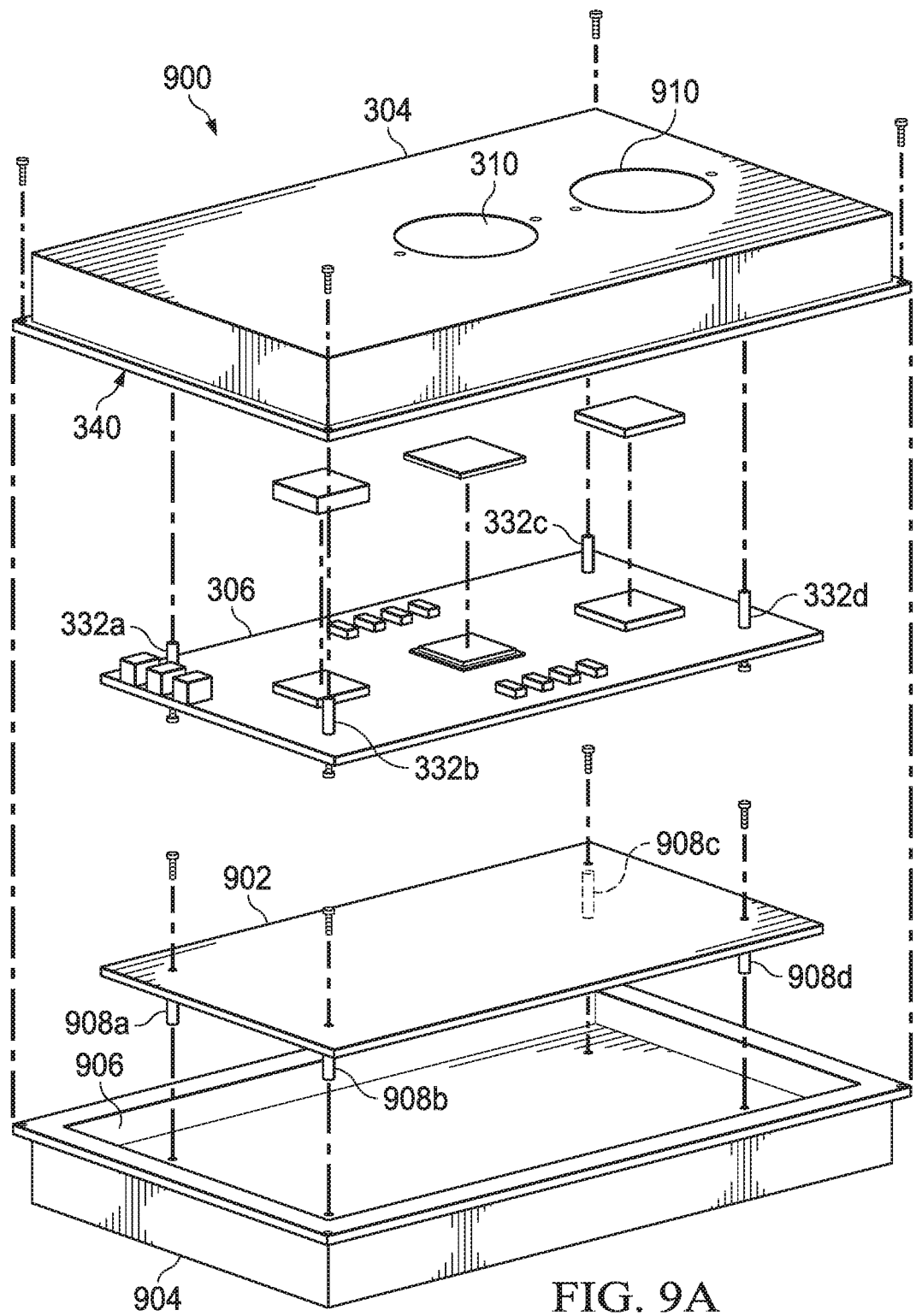

FIGS. 9A and 9B illustrate various views of a system 900, according to some embodiments of the present disclosure. The system 900 is an example of the system 200 of FIG. 2. FIG. 9A is a partially exploded diagram of the system 900. FIG. 9B is a diagram of the system 900 when at least partially assembled.

The system 900 comprises a computing system and a heat-transfer system to transfer heat away from the computing system. The heat-transfer system includes a housing 304, two cold-blocks (e.g., the cold-blocks 400 and 600, shown in FIG. 9B), and housing 904. The housings 304 and 904 are symmetric in overall shape (e.g., excluding the receptacles). Fasteners fasten the housings 304 and 904 to one another to form a cavity in which to enclose the computing system. The computing system includes circuit board 306 which supports a plurality of heat-generating components and a circuit board 902 which supports a plurality of heat-generating components (not visible in FIG. 9A due to being opposite a visible side of the circuit board 902). Pillars 332a, 332b, 332c, and 332d support the circuit board 306 on the housing 304 and suspend them within the cavity 340. Pillars 908a, 908b, 908c, and 908d support the circuit board 902 on the housing 904 and suspend them within the cavity 906.

The system 900 is similar to the system 300 as described with respect to FIGS. 3A, 3B, and 3C. Some of the like components are not described and/or not described in detail here only for the sake of brevity. Some differences between the system 900 and the system 300 is that the system 900 includes two symmetric housings 304 and 904 to enclose two circuit boards (306 and 902) while the system 300 uses a housing and a plate to enclose one circuit board; the circuit boards 306 and 902 are suspended from the housings 304 and 904 in the system 900 while the circuit board 306 is supported on plate in the system 300; and the system 900 includes two receptacles 310 and 910 for receiving two cold-blocks 600 and 400 to cool heat-generating components (e.g., the IC 326 and the processor 328) while the system 300 includes a single receptacle 310. Having two circuit boards 306 and 902 provides more space on which to couple heat-generating components such as processors, ICs, the like. The second housing 904 cools the components on the additional circuit board 902. The circuit boards 306 and 902 being suspended from the housings 304 and 904 reduces the number of components in the stack-up (e.g., removing the plate from the stack-up) and therefore can further reduce the size of the gap between the heat generating components on the circuit boards 306 and 902 and the housings 304 and 904. The inclusion of two receptacles 310 and 910 enables adjusting the gap size between the two heat generating components on the circuit board 306.

Figure 10:
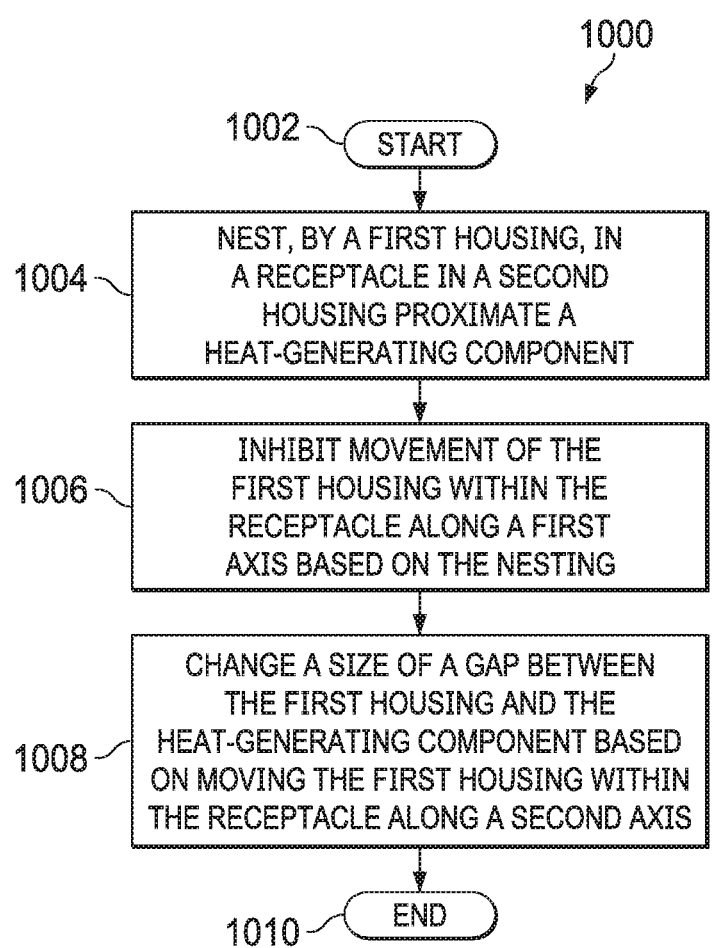
FIG. 10 illustrates a method, according to some embodiments of the present disclosure.

FIG. 10 illustrates a method according to some embodiments of the present disclosure. The method 1000 comprises: 1002, initiation; 1004, nesting, by a first housing, in a receptacle in a second housing proximate a heat-generating component; 1006, inhibiting movement of the first housing within the receptacle along a first axis based on the nesting; 1008, changing a size of a gap between the first housing and the heat-generating component based on moving the first housing within the receptacle along a second axis; and a termination 1010. The method 1000 may be executed by systems, apparatuses, and/or devices. What follows is a description of further details of the method 1000.

Method 1000 begins at 1002, which may coincide with a start/end of other methods, logic, routines, and/or applications.

At 1004, the first housing nests in the receptacle in the second housing. The first housing nests proximate a heat-generating component. The first housing may receive heat from the heat-generating component. In some cases, the first housing applies a load to the heat-generating component (e.g., based on a spring, a frame, a jig, a weight or other object to impose the load). The first housing may include a cold-block (e.g., 400, 600) of the present disclosure. The second housing may comprise a housing of the present disclosure (e.g., 304, 904).

At 1006, movement of the first housing within the receptacle is inhibited along a first axis based on the first housing being nested in the receptacle. In some embodiments, the first housing and the receptacle match in size and shape. In such examples, the corresponding size and shape enables the receptacle to limit movement in one or more directions.

At 1008, a size of a gap between the first housing and the heat-generating component is changed based on moving the first housing within the receptacle along a second axis. The first axis and the second axis are perpendicular to on another. For example, the first axis may correspond to an in-plane direction while the second axis may correspond to an out-of-plane direction. After the change is made, the size of the gap can be maintained by fixing a position of the first housing along the second axis.

In some embodiments, the method 1000 can loop between 1006 and 1008 to size of the gap along the second axis while inhibiting movement along the first axis more than once. The method 1000 ends at 1010, which may coincide with a start/end of other methods, logic, routines, and/or applications Some Figures of the present disclosure illustrate a heat-transfer system in a vertical orientation (e.g., perpendicular to a horizontal plane, parallel to a vertical plane). However, embodiments of the present disclosure may be deployed in any orientation (e.g., vertically, horizontally, diagonally, up-side down relative to the Figures or any orientation). In some examples, a heat-transfer system is oriented at an angle that is oblique to a horizontal plane (e.g., is not horizontally oriented and at least some vertical extent). In some examples, a heat-transfer system is oriented at an angle that is oblique to a vertical plane (e.g., is not vertically oriented and at least some horizontal extent).

While this specification contains many specific implementation details, these should not be construed as limitations on the scope of any inventions or of what may be claimed, and rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

The following examples pertain to some embodiments of the present disclosure.

Example 1 is an apparatus comprising: a first housing comprising a surface operable to receive heat from a heat-generating component; and a second housing comprising a receptacle operable to receive the first housing, wherein the receptacle is operable to inhibit movement of the first housing along a first axis and facilitate movement of the first housing along a second axis, wherein the first housing is moveable within the receptacle along the second axis and movement of the first housing along the second axis is operable to change a size of a gap between the surface and the heat-generating component.

Example 2 includes the subject matter of Example 1, and may further comprise a locking mechanism extending between opposing faces of the first housing and the receptacle, wherein the locking mechanism is lockable to fix a position of the first housing along the second axis and to fix the size of the gap.

Example 3 includes the subject matter of any one or more of Examples 1-2, and may further comprise the first housing further comprises: a reservoir comprising a cavity operable to contain a liquid.

Example 4 includes the subject matter of Example 3, wherein the first housing further comprises: a plurality of openings in an exterior of the first housing to facilitate flow of the liquid through the cavity.

Example 5 includes the subject matter of Example 4, wherein the first housing further comprises: a lid enclosing the cavity.

Example 6 includes the subject matter of Example 5, wherein the first housing further comprises:
a manifold comprising a plurality of passages coupling the cavity and the plurality of openings.

Example 7 includes the subject matter of any one or more of Examples 1-6, and may further comprise: a tube connecting an opening in the first housing to an opening in the second housing, wherein the tube is operable to transfer a liquid between the first housing and the second housing to cool the heat generating component.

Example 8 includes the subject matter of any one or more of Examples 1-7, wherein the first housing and the second housing form a portion of a cavity enclosing the heat-generating component; and may further comprise: a seal located between opposing surfaces of the first housing and the receptacle, the seal is operable to inhibit passage of fluid between the opposing surfaces of the first housing and the receptacle.

Example 9 includes the subject matter of any one or more of Examples 1-8, and may further comprise a thermal interface material filling the gap, wherein the thermal interface material is operable to conduct thermal energy from the heat-generating component to the surface.

Example 10 includes the subject matter of Example 9, and may further comprise a fastener to couple the first housing to the second housing.

Example 11 includes the subject matter of Example 10, and may further comprise:
a spring to compress the thermal interface material between the first housing and the heat-generating component.

Example 12 includes the subject matter of Example 11, and may further comprise the spring surrounds a portion of the fastener.

Example 13 includes the subject matter of any one or more of Examples 1-12, wherein the second housing comprises a tab operable to support at least a portion of the first housing.

Example 14 includes the subject matter of any one or more of Examples 1-13, wherein the receptacle comprises an opening.

Example 15 includes the subject matter of any one or more of Examples 1-14, wherein first housing and the second housing are discrete housings.

Example 16 includes the subject matter of Example 7, wherein the second housing comprises: a conduit operable to facilitate flow of the liquid through the second housing.

Example 17 includes the subject matter of Example 16, wherein the second housing comprises: a planar member comprising: an outer surface, and an inner surface, wherein the conduit is located between the inner surface and the outer surface.

Example 18 includes the subject matter of any one or more of Examples 1-17, wherein the heat-generating component comprises at least one selected from the group consisting of: a processor, an integrated circuit, a power source, a power converter, and a sensor.

Example 19 includes the subject matter of any one or more of Examples 1-18, and may further comprise: a circuit board, wherein the heat-generating component is coupled to the circuit board.

Example 20 includes the subject matter of Example 19, and may further comprise: a die coupled to the circuit board with solder.

Example 21 includes the subject matter of Example 19, and may further comprise a plurality of heat-generating components, wherein each of the plurality of heat-generating components is coupled to the circuit board.

Example 22 includes the subject matter of Example 21, wherein the second housing is operable to receive heat from the plurality of heat-generating components.

Example 23 includes the subject matter of Example 3, wherein the reservoir comprises a plurality of fins within the cavity to direct flow of the liquid.

Example 24 includes the subject matter of any one or more of Examples 1-23, and may further comprise a pump operable to pump a liquid.

Example 25 includes the subject matter of any one or more of Examples 1-24, wherein the first axis and the second axis are perpendicular to one another.

Example 26 is a system comprising: a circuit board; a heat-generating component coupled to the circuit board; and a housing enclosing the heat-generating component and the circuit board; the housing comprising: a first housing comprising a surface operable to receive heat from a heat-generating component; and a second housing comprising a receptacle operable to receive the first housing, wherein the receptacle is operable to inhibit movement of the first housing along a first axis and facilitate movement of the first housing along a second axis; and wherein the first housing is moveable within the receptacle along the second axis and movement of the first housing along the second axis is operable to change a size of a gap between the surface and the heat-generating component.

Example 27 includes the subject matter of Example 26, further comprising a locking mechanism extending between opposing faces of the first housing and the receptacle, wherein the locking mechanism is lockable to fix a position of the first housing along the second axis and to fix the size of the gap.

Example 28 includes the subject matter of any one or more of Examples 26-27, wherein the first housing further comprises: a reservoir comprising a cavity operable to contain a liquid.

Example 29 includes the subject matter of Example 28, wherein the first housing further comprises: a plurality of openings in an exterior of the first housing to facilitate flow of the liquid through the cavity.

Example 30 includes the subject matter of Example 29, wherein the first housing further comprises: a lid enclosing the cavity.

Example 31 includes the subject matter of Example 30, wherein the first housing further comprises: a manifold comprising a plurality of passages coupling the cavity and the plurality of openings.

Example 32 includes the subject matter of any one or more of Examples 26-31, further comprising: a tube connecting an opening in the first housing to an opening in the second housing, wherein the tube is operable to transfer a liquid between the first housing and the second housing to cool the heat generating component.

Example 33 includes the subject matter of any one or more of Examples 26-32, wherein the first housing and the second housing form a portion of a cavity enclosing the heat-generating component; and the system further comprises: a seal located between opposing surfaces of the first housing and the receptacle, the seal is operable to inhibit passage of fluid between the opposing surfaces of the first housing and the receptacle.

Example 34 includes the subject matter of any one or more of Examples 26-33, further comprising a thermal interface material filling the gap, wherein the thermal interface material is operable to conduct thermal energy from the heat-generating component to the surface.

Example 35 includes the subject matter of Example 34, further comprising a fastener to couple the first housing to the second housing.

Example 36 includes the subject matter of Example 35, further comprising: a spring to compress the thermal interface material between the first housing and the heat-generating component.

Example 37 includes the subject matter of Example 36, wherein the spring surrounds a portion of the fastener.

Example 38 includes the subject matter of any one or more of Examples 26-37, wherein the second housing comprises a tab operable to support at least a portion of the first housing.

Example 39 includes the subject matter of any one or more of Examples 26-38, wherein the receptacle comprises an opening.

Example 40 includes the subject matter of any one or more of Examples 26-40, wherein first housing and the second housing are discrete housings.

Example 41 includes the subject matter of Example 32, wherein the second housing comprises: a conduit operable to facilitate flow of the liquid through the second housing.

Example 42 includes the subject matter of Example 41, wherein the second housing comprises: a planar member comprising: an outer surface, and an inner surface, wherein the conduit is located between the inner surface and the outer surface.

Example 43 includes the subject matter of any one or more of Examples 26-42, wherein the heat-generating component comprises at least one selected from the group consisting of: a processor, an integrated circuit, a power source, a power converter, and a sensor.

Example 44 includes the subject matter of any one or more of Examples 26-43, further comprising: a circuit board, wherein the heat-generating component is coupled to the circuit board.

Example 45 includes the subject matter of Example 44, further comprising: a die coupled to the circuit board with solder.

Example 46 includes the subject matter of Example 44 and/or 45, further comprising: a plurality of heat-generating components, wherein each of the plurality of heat-generating components is coupled to the circuit board.

Example 47 includes the subject matter of Example 46, wherein the second housing is operable to receive heat from the plurality of heat-generating components.

Example 48 includes the subject matter of Example 29, wherein the reservoir comprises a plurality of fins within the cavity to direct flow of the liquid.

Example 49 includes the subject matter of any one or more of Examples 26-48, further comprising a pump operable to pump a liquid.

Example 50 includes the subject matter of any one or more of Examples 26-49, wherein the first axis and the second axis are perpendicular to one another.

Example 51 is a method comprising: nesting, by a first housing, in a receptacle in a second housing, wherein the first housing is to receive heat from a heat-generating component; inhibiting movement of the first housing within the receptacle along a first axis based on the nesting; and changing a size of a gap between the first housing and the heat-generating component based on moving the first housing within the receptacle along a second axis.

Example 52 includes the subject matter of Example 51, and may further comprise: receiving, by the first housing, heat from a heat-generating component.

Example 53 includes the subject matter of any one or more of Examples 51-2, and may further comprise: applying, by the first housing, a load to a heat-generating component.

Example 54 includes the subject matter of any one or more of Examples 51-53, and may further comprise: fixing the size of the gap based on fixing a position of the first housing along the second axis.

Example 55 includes the subject matter of Example 53, and may further comprise: distributing liquid through the first housing and the second housing.

Example 56 includes the subject matter of any one or more of Examples 51-55, and may further comprise: receiving, by the first housing, a liquid from the second housing; and transferring, within the first housing, heat from the heat-generating component to the liquid.

Example 57 includes the subject matter of any one or more of Examples 51-56, and may further comprise: forming, by the first housing and the second housing, a portion of a cavity enclosing the heat-generating component; and sealing between opposing surfaces of the first housing and the receptacle to inhibit passage of fluid between the opposing surfaces of the first housing and the receptacle.

Example 58 includes the subject matter of any one or more of Examples 51-57, and may further comprise: filling the gap with a thermal interface material; and conducting, by the thermal interface material, thermal energy from the heat-generating component to the first housing.

Example 59 includes the subject matter of any one or more of Examples 51-58, and may further comprise: fastening the first housing to the second housing.

Example 60 includes the subject matter of Example 58, and may further comprise: compressing the thermal interface material between the first housing and the heat-generating component.

Example 61 includes the subject matter of any one or more of Examples 51-60, and may further comprise: supporting, by the second housing, at least a portion of the first housing.

Example 62 includes the subject matter of any one or more of Examples 51-61, wherein the receptacle comprises an opening.

Example 63 includes the subject matter of any one or more of Examples 51-62, wherein first housing and the second housing are discrete housings.

Example 64 includes the subject matter of any one or more of Examples 51-63, wherein the heat-generating component comprises at least one selected from the group consisting of: a processor, an integrated circuit, a power source, a power converter, and a sensor.

Example 65 includes the subject matter of any one or more of Examples 51-64, and may further comprise: coupling the heat-generating component to a circuit board.

Example 66 includes the subject matter of Example 65, and may further comprise: soldering a die to the circuit board.

Example 67 includes the subject matter of Example 65, and may further comprise: coupling a plurality of heat-generating components to the circuit board.

Example 68 includes the subject matter of Example 67, and may further comprise: receiving, by the second housing, heat from the plurality of heat-generating components.

Example 69 includes the subject matter of any one or more of Examples 51-68, further comprising: pumping a liquid through the first housing and/or the second housing.

Example 70 includes the subject matter of any one or more of Examples 51-69, wherein the first axis and the second axis are perpendicular to one another.

Example 71 is an apparatus comprising means to perform a method as specified in any of Examples 51-70.

Example 72 is a machine-readable storage including machine-readable instructions, when executed, to implement a method or realize an apparatus as specified in any of Examples 51-70.

Example 73 is a machine readable medium including code, when executed, to cause a machine to perform the methods of any one of Examples 51-70.

Example 74 is an apparatus comprising: a processor; and a memory coupled to the processor to store instructions, the instructions, when executed by the processor, to perform the methods of any one of Examples 51-70.

What is claimed is:

1. An apparatus comprising:
   a first housing comprising a surface operable to receive heat from a heat-generating component, wherein the first housing includes a first component, a second component, and a third component coupled together to form a cavity to contain a liquid;
   a second housing comprising a receptacle operable to receive the first housing, wherein the receptacle is operable to inhibit movement of the first housing along a first axis and facilitate movement of the first housing along a second axis,
   wherein the first housing is moveable within the receptacle along the second axis and movement of the first housing along the second axis is operable to change a size of a gap between the surface and the heat-generating component;
   a first tube and a second tube connecting the first housing and the second housing, wherein the first and second tubes transfer the liquid in the cavity between the first housing and the second housing; and
   a threaded shaft extending between opposing faces of the first housing and the receptacle, wherein the threaded shaft is lockable to fix a position of the first housing along the second axis and to fix the size of the gap.

2. The apparatus of claim 1, further comprising a thermal interface material filling the gap, wherein the thermal interface material is operable to conduct thermal energy from the heat-generating component to the surface.

3. The apparatus of claim 2, further comprising a fastener to couple the first housing to the second housing.

4. The apparatus of claim 1, wherein the second housing comprises a tab operable to support at least a portion of the first housing.

5. The apparatus of claim 1, wherein first housing and the second housing are discrete housings.

6. The apparatus of claim 1, wherein the second housing comprises:
   a conduit operable to facilitate flow of a liquid through the second housing.

7. The apparatus of claim 1, wherein the heat-generating component comprises at least one selected from the group consisting of: a processor, an integrated circuit, a power source, a power converter, and a sensor.

8. The apparatus of claim 1, further comprising:
   a circuit board, wherein the heat-generating component is coupled to the circuit board.

9. The apparatus of claim 1, wherein the first axis and the second axis are perpendicular to one another.

10. A system comprising:
    a circuit board;
    a heat-generating component coupled to the circuit board; and
    a housing enclosing the heat-generating component and the circuit board, the housing comprising:
      a first housing comprising a surface operable to receive heat from a heat-generating component, wherein the first housing includes a first component, a second component, and a third component coupled together to form a cavity to contain a liquid;
      a second housing comprising a receptacle operable to receive the first housing, wherein the receptacle is operable to inhibit movement of the first housing along a first axis and facilitate movement of the first housing along a second axis;
      wherein the first housing is moveable within the receptacle along the second axis and movement of the first housing along the second axis is operable to change a size of a gap between the surface and the heat-generating component;
      a first tube and a second tube connecting the first housing and the second housing, wherein the first and second tubes transfer the liquid in the cavity between the first housing and the second housing; and
      a threaded shaft extending between opposing faces of the first housing and the receptacle, wherein the threaded shaft is lockable to fix a position of the first housing along the second axis and to fix the size of the gap.

11. The system of claim 10, further comprising a thermal interface material filling the gap, wherein the thermal interface material is operable to conduct thermal energy from the heat-generating component to the surface.

12. The system of claim 11, further comprising a fastener to couple the first housing to the second housing.

13. The system of claim 10, wherein the second housing comprises a tab operable to support at least a portion of the first housing.

14. The system of claim 10, wherein the second housing comprises:
    a conduit operable to facilitate flow of a liquid through the second housing.

15. The system of claim 10, wherein the heat-generating component comprises at least one selected from the group consisting of: a processor, an integrated circuit, a power source, a power converter, and a sensor.

16. A method comprising:
    nesting, by a first housing, in a receptacle in a second housing, wherein the first housing is to receive heat from a heat-generating component, and wherein the first housing includes a first component, a second component, and a third component coupled together to form a cavity to contain a liquid;
    connecting the first housing to the second housing by a first tube and a second tube, wherein the first and second tubes transfer the liquid in the cavity between the first housing and the second housing;
    inhibiting movement of the first housing within the receptacle along a first axis based on the nesting;
    changing a size of a gap between the first housing and the heat-generating component based on moving the first housing within the receptacle along a second axis; and
    locking a threaded shaft to fix a position of the first housing along the second axis and to fix the size of the gap, the threaded shaft extending between opposing faces of the first component of the first housing and the receptacle.

17. The method of claim 16, further comprising:
distributing the liquid through the first housing and the second housing.

18. The method of claim 16, further comprising:
filling the gap with a thermal interface material; and
conducting, by the thermal interface material, thermal energy from the heat-generating component to the first housing.

19. The method of claim 16, further comprising:
fastening the first housing to the second housing.

20. The method of claim 18, further comprising:
compressing the thermal interface material between the first housing and the heat-generating component.

21. The method of claim 16, further comprising:
supporting, by the second housing, at least a portion of the first housing.

* * * * *